United States Patent
Hematy et al.

(10) Patent No.: US 9,625,514 B1
(45) Date of Patent: Apr. 18, 2017

(54) ELECTRICAL TRANSFORMER OPEN AND SHORT DETECTOR

(71) Applicant: Maxim Integrated Products, Inc., San Jose, CA (US)

(72) Inventors: Arman Hematy, San Jose, CA (US); Jonathan R. Strode, Los Altos, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 395 days.

(21) Appl. No.: 14/481,129

(22) Filed: Sep. 9, 2014

Related U.S. Application Data

(60) Provisional application No. 62/018,037, filed on Jun. 27, 2014.

(51) Int. Cl.
*G01R 31/02* (2006.01)
*H02M 3/335* (2006.01)

(52) U.S. Cl.
CPC ......... *G01R 31/027* (2013.01); *G01R 31/026* (2013.01); *H02M 3/33515* (2013.01); *H02M 3/33523* (2013.01)

(58) Field of Classification Search
CPC ............... G01R 31/026; G01R 31/027; H02M 3/33507; H02M 3/33515; H02M 3/33523
See application file for complete search history.

(56) References Cited

U.S. PATENT DOCUMENTS

| | | | | |
|---|---|---|---|---|
| 7,724,831 B2* | 5/2010 | Fukahori | ............... | H04L 5/1423 340/310.17 |
| 8,111,761 B2* | 2/2012 | Hershbarger | ....... | H04L 25/0266 375/219 |
| 8,265,174 B2* | 9/2012 | Fukahori | ............... | H04L 5/1423 375/258 |
| 2008/0048902 A1* | 2/2008 | Rylov | ................. | H03M 1/1215 341/155 |
| 2008/0192509 A1* | 8/2008 | Dhuyvetter | ....... | H02M 3/33523 363/17 |
| 2009/0309567 A1* | 12/2009 | Morroni | ................ | H02M 3/157 323/283 |

OTHER PUBLICATIONS

8-/6-/4-Channel DAS with 16-Bit, Bipolar Input, Simultaneous Sampling ADC; www.analog.com; 2010-2012; Analog Devices, Inc.; pp. 1-36.
Analog Devices, "8-/6-/4-Channel DAS with 16-Bit, Bipolar Input, Simultaneous Sampling ADC", AD7606/AD7606-6/AD7606-4, Rev. C, D08479-0/1/12(c), pp. 1-36, © 2010-2012 Analog Devices, Inc.

* cited by examiner

*Primary Examiner* — Jessica Han
(74) *Attorney, Agent, or Firm* — Advent, LLP

(57) ABSTRACT

A circuit for monitoring the health of the transformers is disclosed. In an implementation, the circuit includes a transformer that provides an input signal and a pulse generator that generates a pulse signal. An analog-to-digital converter receives a combined signal that includes the input signal and the pulse signal, and the analog-to-digital converter converts the combined signal to a digital representation of the combined signal. The circuit includes a first digital filter and a second digital filter that are connected to the analog-to-digital converter. The first digital filter reconstructs an amplitude characteristic of the input signal, and the second digital filter reconstructs the pulse signal. The circuit also includes a controller that indicates a short circuit or an open circuit associated with the transformer based upon a value of the reconstructed pulse signal.

20 Claims, 1 Drawing Sheet

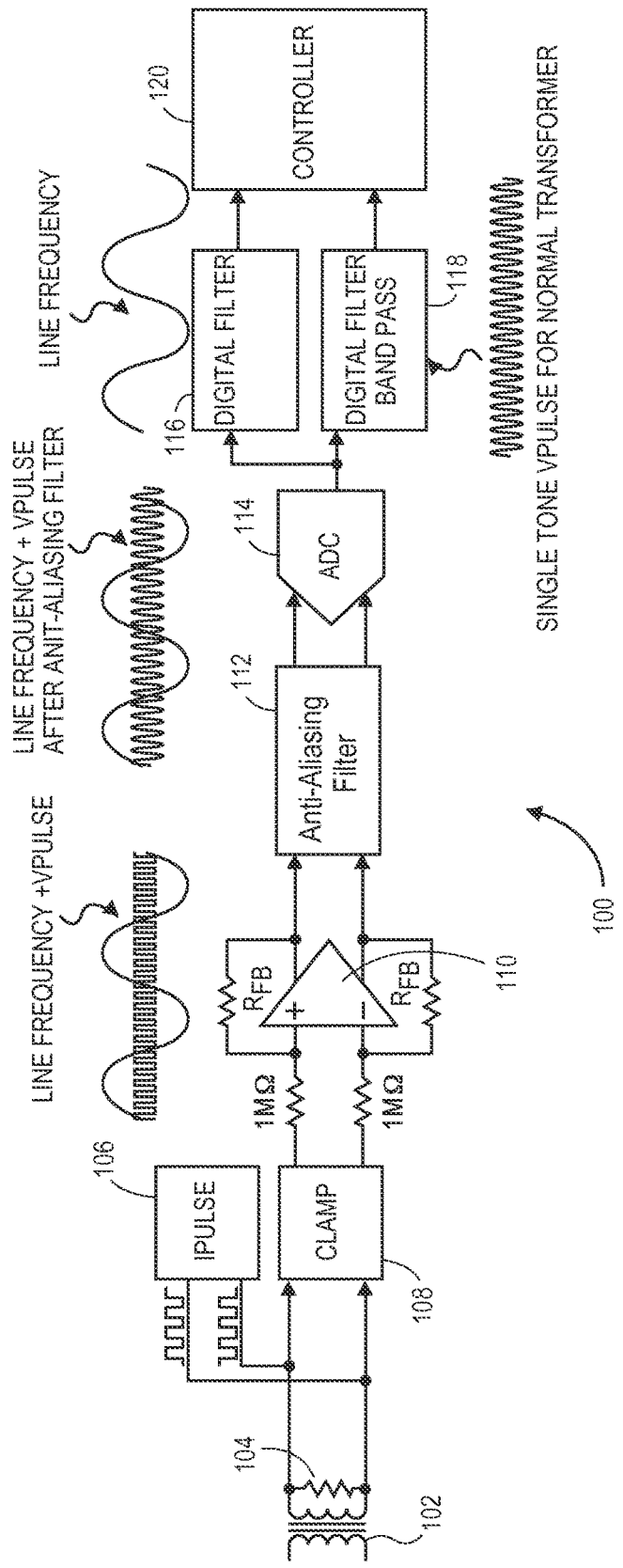

_US 9,625,514 B1_

ELECTRICAL TRANSFORMER OPEN AND SHORT DETECTOR

CROSS-REFERENCE TO RELATED APPLICATIONS

The present application claims the benefit under 35 U.S.C. §119(e) of U.S. Provisional Application Ser. No. 62/018,037, filed Jun. 27, 2014, and titled "ELECTRICAL TRANSFORMER OPEN AND SHORT DETECTOR," which is herein incorporated by reference in its entirety.

BACKGROUND

Power systems typically comprise a network of distribution elements that carries electricity from a transmission system to consumers. Power systems typically employ transformers, which comprise electrical devices that transfer energy between two circuit elements through electromagnetic inductions. These transformers may operate by generating a varying electromagnetic field based upon an alternating electric current flow through a primary winding, which induces a varying magnetic flux in a core of the transformer. The varying electromagnetic field induces an electromotive force in a secondary winding, which may be measured as a voltage at the output terminals.

SUMMARY

A circuit for monitoring the health of the transformers is disclosed. In an implementation, the circuit includes a transformer that provides an input signal and a pulse generator that generates a pulse signal. An analog-to-digital converter receives a combined signal that includes the input signal and the pulse signal, and the analog-to-digital converter converts the combined signal to a digital representation of the combined signal. The circuit includes a first digital filter and a second digital filter that are connected to the analog-to-digital converter. The first digital filter reconstructs an amplitude characteristic of the input signal, and the second digital filter reconstructs the pulse signal. The circuit also includes a controller that indicates a short circuit or an open circuit associated with the transformer based upon a value of the reconstructed pulse signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying FIGURES. The use of the same reference numbers in different instances in the description and the FIGURES may indicate similar or identical items.

FIG. 1 is a block diagram illustrating a circuit in accordance with an example implementation of the present disclosure.

DETAILED DESCRIPTION

Overview

Safety and reliability are important in the distribution and automation (DA) industry. Typically, redundant measurements, extensive PC board housekeeping, and lengthy analytical data processing are utilized to improve the quality, reliability, and safety of the power systems. However, current techniques do not provide adequate abilities to monitor the health of various transformers in the power systems.

Accordingly, a circuit for monitoring the health of the transformers is disclosed. In an implementation, the circuit includes a transformer that provides an input signal and a pulse generator that generates a pulse signal. An analog-to-digital converter receives a combined signal that includes the input signal and the pulse signal, and the analog-to-digital converter converts the combined signal to a digital representation of the combined signal. The circuit includes a first digital filter and a second digital filter that are connected to the analog-to-digital converter. The first digital filter reconstructs an amplitude characteristic of the input signal, and the second digital filter reconstructs the pulse signal. The circuit also includes a controller that indicates a short circuit, an open circuit, or any other significant and/or unusual defect associated with the transformer based upon a value of the reconstructed pulse signal. For example, the controller can indicate a short circuit associated with the transformer based upon the value of the reconstructed pulse signal. In another example, the controller can indicate an open circuit associated with the transformer based upon the value of the reconstructed pulse signal. In yet another example, the controller can indicate other significant and/or unusual defects associated with the transformer based upon the value of the reconstructed pulse signal

Example Implementation

FIG. 1 illustrates a system 100 in accordance with example implementations of the present disclosure. As shown, the system 100 includes a transformer 102 that receives an input signal (e.g., an input voltage signal) having a line frequency. The input voltage signal may have an amplitude characteristic and a frequency characteristic (e.g., the line frequency). The transformer 102 comprises an electrical device for transferring energy between two circuits utilizing electromagnetic induction. For example, the transformer 102 may provide voltage conversion functionality for converting an alternating current (AC) voltage to another AC voltage (e.g., a higher or lower voltage amplitude) without substantially altering the frequency characteristics of the AC voltage.

As shown in FIG. 1, the system 100 also includes a shunt element 104 for sensing a line frequency of the input signal. In an implementation, the shunt element 104 comprises a shunt resistor. The system 100 also includes a pulse generator 106 and a clamp device 108. The pulse generator 106 generates current pulses for the system 100, and the clamp device 108 modifies the signal such that the amplitude peaks of the signal are at a reference level. For example, the pulse generator 106 generates a signal having a frequency characteristic that is different from the frequency characteristic of the input signal. For instance, the frequency characteristic of the signal generated by the pulse generator may be at least approximately ten kilo-hertz. The input signal and the pulse generator signal (e.g., a VPULSE signal) are combined in the voltage domain and provided to the clamp device 108. An amplifier 110 is electrically connected to the clamp device 108, and the amplifier 110 amplifies signal provided to the input of the amplifier 110, and the amplified signal is output by the amplifier 110. In an implementation, the amplifier 110 comprises a programmable gain amplifier. For example, the gain (e.g., amplification) of the amplifier 110 may be adjusted based upon the requirements of the system 100.

A filter 112 is electrically connected to the output of the amplifier 110. In implementations, the filter 112 comprises an anti-aliasing filter. The filter 112 provides functionality to at least partially restrict the bandwidth of the signal output by the amplifier 110 to allow sampling of the signal. For example, the filter 112 removes unwanted signals from the input signal to an analog-to-digital converter 114. For instance, the filter 112 may filter signals having frequency characteristics at or above thirty kilo-hertz. The analog-to-digital converter 114 provides analog-to-digital conversion functionality. For example, the analog-to-digital converter 114 converts the analog signal provided by the filter 112 to a digital representation of the signal.

As shown in FIG. 1, a first digital filter 116 and a second digital filter 118 are electrically connected to the output of the analog-to-digital converter 114. The first digital filter 116 reconstructs (e.g., recovers) the line frequency of the input signal, and the second digital filter reconstructs the VPULSE signal. For example, the second digital filter reconstructs the VPULSE signal, which can indicate one or more conditions of the system 100. The VPULSE signal can be defined as indicating a short condition, an open condition, other major conditions (e.g., a damaged transformer, etc.), or a normal condition. For example, the controller 120 receives the reconstructed VPULSE signal and determines a condition of the system 100 based upon the value of the reconstructed VPULSE signal. For example, the controller 120 may indicate a normal condition when the VPULSE signal has an amplitude that equates to a known amplitude based upon a calibration result. In another example, the controller 120 may indicate there is a short circuit in the transformer 102 or the shunt element 104 when the reconstructed VPULSE signal has an amplitude that is smaller than the known amplitude, or the amplitude of the reconstructed VPULSE signal is zero. The known amplitude may be a predefined (e.g., factory) amplitude signal. In yet another example, the controller 120 indicates that there is an open connection to the transformer 102 when the amplitude of the reconstructed VPULSE signal is greater than the known amplitude. Thus, based upon the VPULSE signal, the controller 120 can detect one or more issues (e.g., problems) with the transformer 102 and/or the shunt element 104.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A circuit comprising:
   a transformer configured to provide an input signal, the input signal comprising an input signal amplitude characteristic and an input signal frequency characteristic;
   a pulse generator configured to generate a pulse signal, the pulse signal comprising a pulse signal amplitude characteristic and a pulse signal frequency characteristic;
   an analog-to-digital converter in electrical communication with the transformer and the pulse generator, the analog-to-digital converter configured to receive a combined signal comprising the input signal and the pulse signal, the analog-to-digital converter configured to convert the combined signal to a digital representation of the combined signal;
   a first digital filter in electrical communication with the analog-to-digital converter, the first digital filter configured to reconstruct the amplitude characteristic of input signal;
   a second digital filter in electrical communication with the analog-to-digital converter, the second digital filter configured to reconstruct the pulse signal; and
   a controller electrically connected to the first digital filter and the second digital filter, the controller configured to indicate at least one of a short or an open associated with the transformer based upon a value of the reconstructed pulse signal.

2. The circuit as recited in claim 1, further comprising a shunt element electrically connected to the transformer, the shunt element configured to sense the input signal frequency characteristic.

3. The circuit as recited in claim 2, wherein the shunt element comprises a shunt resistor.

4. The circuit as recited in claim 1, further comprising a clamp device electrically connected to the transformer; an amplifier electrically connected to the transformer, the amplifier configure to amplify the combined signal to generate an amplified combined signal; a filter electrically connected to the amplifier, the filter configured to filter the amplified combined signal, wherein the filter provides a filtered amplified combined signal to the analog-to-digital converter.

5. The circuit as recited in claim 4, wherein the filter comprises an anti-aliasing filter.

6. The circuit as recited in claim 5, wherein the anti-aliasing filter is configured to filter the amplified combined signal having a frequency characteristic of greater than thirty kilo-hertz.

7. The circuit as recited in claim 1, wherein the amplifier comprises a programmable gain amplifier.

8. A circuit comprising:
   a transformer configured to provide an input signal, the input signal comprising an input signal amplitude characteristic and an input signal frequency characteristic;
   a pulse generator configured to generate a pulse signal, the pulse signal comprising a pulse signal amplitude characteristic and a pulse signal frequency characteristic;
   an analog-to-digital converter in electrical communication with the transformer and the pulse generator, the analog-to-digital converter configured to receive a combined signal from a filter, the combined signal comprising the input signal and the pulse signal, the analog-to-digital converter configured to convert the combined signal to a digital representation of the combined signal;
   a first digital filter connected to the analog-to-digital converter, the first digital filter configured to reconstruct the amplitude characteristic of input signal based upon the digital representation of the combined signal;
   a second digital filter connected to the analog-to-digital converter, the second digital filter configured to reconstruct the pulse signal based upon the digital representation of the combined signal; and
   a controller connected to the first digital filter and the second digital filter, the controller configured to indicate at least one of a short or an open associated with the transformer based upon a value of the reconstructed pulse signal.

9. The circuit as recited in claim 8, further comprising a shunt element connected to the transformer, the shunt element configured to sense the input signal frequency characteristic.

10. The circuit as recited in claim 9, wherein the shunt element comprises a shunt resistor.

11. The circuit as recited in claim 8, further comprising a clamp device electrically connected to the transformer; and an amplifier electrically connected to the transformer, the amplifier configure to amplify the combined signal to generate an amplified combined signal, wherein the amplifier is configured to provide an amplified combined signal to the filter.

12. The circuit as recited in claim 8, wherein the filter comprises an anti-aliasing filter.

13. The circuit as recited in claim 12, wherein the anti-aliasing filter is configured to filter the amplified combined signal having a frequency characteristic of greater than thirty kilo-hertz.

14. The circuit as recited in claim 8, wherein the amplifier comprises a programmable gain amplifier.

15. A circuit comprising:
- a transformer configured to provide an input signal, the input signal comprising an input signal amplitude characteristic and an input signal frequency characteristic;
- a pulse generator electrically configured to generate a pulse signal, the pulse signal comprising a pulse signal amplitude characteristic and a pulse signal frequency characteristic;
- a clamp device electrically connected to the transformer and the pulse generator, the clamp device configured to modify the input signal amplitude characteristic of the input signal and a pulse signal amplitude characteristic of the pulse signal to generate a clamp signal;
- an amplifier electrically connected to the clamp device, the amplifier configure to amplify the clamp signal to generate an amplified clamp signal;
- a filter electrically connected to the amplifier, the filter configured to filter the amplified clamp signal to generate a filtered amplified clamp signal;
- an analog-to-digital converter electrically connected to the filter, the analog-to-digital converter configured to receive the filtered amplified clamp signal, the filtered amplified clamp signal comprising the input signal and the pulse signal, the analog-to-digital converter configured to convert the combined signal to a digital representation of the filtered amplified clamp signal;
- a first digital filter electrically connected to the analog-to-digital converter, the first digital filter configured to reconstruct the amplitude characteristic of input signal based upon the digital representation of the filtered amplified clamp signal;
- a second digital filter electrically connected to the analog-to-digital converter, the second digital filter configured to reconstruct the pulse signal based upon the digital representation of the filtered amplified clamp signal; and
- a controller electrically connected to the first digital filter and the second digital filter, the controller configured to indicate at least one of a short or an open associated with the transformer based upon a value of the reconstructed pulse signal.

16. The circuit as recited in claim 15, further comprising a shunt element connected to the transformer, the shunt element configured to sense the input signal frequency characteristic.

17. The circuit as recited in claim 16, wherein the shunt element comprises a shunt resistor.

18. The circuit as recited in claim 15, wherein the filter comprises an anti-aliasing filter.

19. The circuit as recited in claim 18, wherein the anti-aliasing filter is configured to filter amplified clamp signals having frequency characteristics greater than thirty kilo-hertz.

20. The circuit as recited in claim 15, wherein the amplifier comprises a programmable gain amplifier.

* * * * *